United States Patent [19]
Ugajin et al.

[11] Patent Number: 5,608,231
[45] Date of Patent: Mar. 4, 1997

[54] FIELD EFFECT TRANSISTOR HAVING CHANNEL WITH PLURAL QUANTUM BOXES ARRANGED IN A COMMON PLANE

[75] Inventors: Ryuichi Ugajin; Toshiyuki Sameshima, both of Kanagawa, Japan

[73] Assignee: Sony Corporation, Tokyo, Japan

[21] Appl. No.: 683,137

[22] Filed: Jul. 18, 1996

Related U.S. Application Data

[63] Continuation of Ser. No. 329,495, Oct. 26, 1994, abandoned.

[30] Foreign Application Priority Data

Oct. 28, 1993 [JP] Japan ................................. 5-292774
Jul. 15, 1994 [JP] Japan ................................. 6-186260

[51] Int. Cl.$^6$ ................. H01L 29/06; H01L 31/0328; H01L 31/0336

[52] U.S. Cl. ................. 257/24; 257/27; 257/192
[58] Field of Search ................. 257/24, 27, 192

[56] References Cited

U.S. PATENT DOCUMENTS 5,032,877  7/1991  Bate .
5,198,879  3/1993  Ohshima ................................. 257/20

*Primary Examiner*—Ngân V. Ngô
*Attorney, Agent, or Firm*—Hill, Steadman & Simpson

[57] ABSTRACT

A field effect transistor has a quantum dot array in its channel region. The quantum dot array is composed of a plurality of quantum dots arranged adjacent to each other on a common plane. Each quantum dot may be made of heterojunction of compound semiconductors or junction of a semiconductor and an insulator. The field effect transistor has a differential negative resistance.

8 Claims, 15 Drawing Sheets

FIELD EFFECT TRANSISTOR HAVING CHANNEL WITH PLURAL QUANTUM BOXES ARRANGED IN A COMMON PLANE

This is a continuation of application Ser. No. 08/329,495, filed Oct. 26 1994, now abandoned.

BACKGROUND OF THE INVENTION

This invention relates to a field effect transistor, and more particular to a field effect transistor using so-called quantum boxes (also called quantum dots) and having a differential negative resistance.

Great hopes are placed to transistors having a differential negative resistance as high-functional devices. For one reason, it is known that, by utilizing a strong non-linearity appearing in their current-to-voltage characteristics (I-V characteristics), a logic circuit may be composed of a less number of transistors. This advantage is of a great importance, considering the present situation where a delay in wiring restricts performance of logic ICs.

There are some transistors reported, having a differential negative resistance. The most widely known one of them is of a type called resonant tunneling hot electron transistors (RHET).

However, such RHET transistors, because of utilizing a resonant tunnel phenomenon, need a semiconductor heterojunction of good uniformity, which compels their structure to be longitudinal with respect to the substrate. Longitudinal RHETs are inconvenient for incorporation into ICs. There is thus a demand for transistors having a differential negative resistance and having a planar structure for easier integration.

OBJECTS AND SUMMARY OF THE INVENTION

It is, therefore, an object of the invention to provide a field effect transistor having a differential negative resistance and having a planar structure facilitating integration.

Consider now a quantum dot array in which quantum dots are two-dimensionally arranged adjacent to each other.

First, physical meaning of "transfer energy" used in the following description will be explained below.

Consideration is made below on a coupled quantum dots system comprising a quantum dot 1 with center coordinates $(r_x, r_y)$ and a quantum dot 2 with center coordinates $(-r_x, -r_y)$. Then, dynamics of electrons in the coupled quantum dots system are discussed on the basis of the LCAO (Linear Combination of Atomic Orbitals) approximation known as an effective approximation method for analyzing the electronic state of a hydrogen molecule ion ($H_2^+$) from an exact solution of the electronic state of an isolated hydrogen atom.

On the basis of the LCAO approximation, when the quantum dot 1 and the quantum dot 2, initially isolated, approach to each other, a split of the width $2\Delta E$ occurs in the energy level $E_0$ in the ground state $|1\rangle$ of the electron in the quantum dot 1 and the ground state $|2\rangle$ of the electron in the quantum dot 2, and two states, bonding state and antibonding state, are obtained. Energies and wave functions of these bonding and antibonding states are shown by:

Bonding State $E_{bonding} = E_0 - \Delta E$

Antibonding State $E_{antibonding} = E_0 + \Delta E$ (1)

$|bonding\rangle \propto [|1\rangle + |2\rangle]$ $|antibonding\rangle \propto [|1\rangle - |2\rangle]$ (2)

$\Delta E$ is called transfer energy, and it gives a criterion for determination of the tunneling time $\tau$ of an electron between quantum dots as referred to later.

If the Hamiltonian of the coupled quantum dots system is expressed $\hat{H}_{LCAO}$, then the bonding state $|bonding\rangle$ and the antibonding state $|antibonding\rangle$ exhibit eigenstates of the Hamiltonianas as described by the following equations:

$\hat{H}_{LCAO}|bonding\rangle = (E_0 | \Delta E)|bonding\rangle$ $\hat{H}_{LCAO}|antibonding\rangle = (E_0 + \Delta E)|antibonding\rangle$ (3)

Assuming that an electron is localized in, for example, the quantum dot 1, this state can be expressed as:

$$|initial\rangle = \frac{1}{\sqrt{2}} [|bonding\rangle + |antibonding\rangle]$$ (4)

By time evolution from this state in accordance with the Schrödinger equation, the state at the time t is:

$$\begin{aligned} |t\rangle &= \exp\left(i\frac{\hat{H}_{LCAO}t}{\hbar}\right)|initial\rangle \\ &= \frac{1}{\sqrt{2}}\left[\exp\left(i\frac{\hat{H}_{LCAO}t}{\hbar}\right)|bonding\rangle + \exp\left(i\frac{\hat{H}_{LCAO}t}{\hbar}\right)|antibonding\rangle\right] \\ &= \frac{1}{\sqrt{2}}\left[e^{i\frac{(E_0-\Delta E)t}{\hbar}}|bonding\rangle + e^{i\frac{(E_0+\Delta E)t}{\hbar}}|antibonding\rangle\right] \\ &= \frac{1}{\sqrt{2}} e^{i\frac{(E_0-\Delta E)t}{\hbar}}[|bonding\rangle + e^{i\frac{2\Delta E t}{\hbar}}|antibonding\rangle] \end{aligned}$$ (5)

It is known from the above statement that the electron heretofore localized in the quantum dot 1 reaches the quantum dot 2 by the time t satisfying:

$$\frac{2\Delta E t}{\hbar} = \pi$$ (6)

Therefore, within the LCAO approximation, the tunneling time $\tau$ of the electron from the quantum dot 1 to the quantum dot 2 may be considered as:

$$\tau = \frac{\pi \hbar}{2\Delta E}$$ (7)

This tunneling time $\tau$ may more generally be expressed as:

$$\tau \sim \frac{\pi \hbar}{2\Delta E} \quad (8)$$

It is known from the foregoing statement that, by most simplifying the dynamics of electrons in a coupled quantum dots system, electrons move due to tunnelling dependent on the magnitude of the transfer energy $\Delta E$ between quantum dots.

Next consideration is made to determine a formula for the transfer energy $\Delta E$ within the LCAO approximation.

Here is taken for consideration a single square quantum dot whose side is 2d long. Then its potential energy is:

$$V(x,y) = \begin{cases} -V_0 & (|x| \leq d, |y| \leq d) \\ 0 & (|x| > d, |y| > d) \end{cases} \quad (9)$$

Therefore, the Hamiltonian of the system is:

$$\hat{H}_{isolate} = K + V(x,y) \quad (10)$$

where K is the kinetic energy. When the ground state of the Hamiltonian is $|\psi_0\rangle$ and its energy is $E_0$, $$\hat{H}_{isolate}|\psi_0\rangle = E_0|\psi_0\rangle \quad (11)$$

is established.

In contrast, the Hamiltonian of a coupled quantum dots system comprising two square quantum dots can be expressed as:

$$\hat{H}_{coupled} = K + V_+(x,y) + V_-(x,y) \quad (12)$$

When, however, the center coordinates of one of the quantum dots and the center coordinates of the other of the quantum dots are written as described above, it results in:

$$V_+(x,y) = V(x-\tau_z, y-\tau_y)$$

$$V_-(x,y) = V(x+\tau_z, y+\tau_y) \quad (13)$$

On the other hand, the wave function of the ground state of the Hamiltonian of the single square quantum dot described by Equation (10) is:

$$\psi_0(x,y) = \langle x,y|\psi_0\rangle \quad (14)$$

Note that the following equations $$\psi_{0+}(x,y) = \psi_0(x-\tau_z, y-\tau_y)$$

$$\psi_{0-}(x,y) = \psi_0(x+\tau_z, y+\tau_y) \quad (15)$$

respectively satisfy $$[K+V_+]\psi_{0+}(x,y) = E_0\psi_{0+}(x,y) \quad (16)$$

$$[K+V_-]\psi_{0-}(x,y) = E_0\psi_{0-}(x,y)$$

After the foregoing preparation, consideration is made to determine the energy eigenvalue of the Hamiltonian of the coupled quantum dots system shown by Equation (12) in the two-dimensional subspace spanned by the eigenstates of the single square quantum dot described by Equation (15) span. Since two eigenstates described by Equation (15) are not orthogonal, first made are orthogonal bases, for example, as follows:

$$|a\rangle = \frac{1}{\sqrt{2(1 - \langle\psi_{0-}|\psi_{+0}\rangle)}} (|\psi_{0+}\rangle - |\psi_{0-}\rangle) \quad (17)$$

$$|b\rangle = \frac{1}{\sqrt{2(1 + \langle\psi_{0-}|\psi_{+0}\rangle)}} (|\psi_{0+}\rangle + |\psi_{0-}\rangle)$$

On the basis of the orthogonal bases, Hamiltonian matrix elements are calculated as follows:

$$\begin{aligned}
\langle a|\hat{H}_{coupled}|a\rangle &= \frac{1}{2(1 - \langle\psi_{0-}|\psi_{0+}\rangle)} (\langle\psi_{0+}| - \langle\psi_{0-}|)[K + V_+ + V_-](|\psi_{0+}\rangle - |\psi_{0-}\rangle) \\
&= \frac{1}{2(1 - \langle\psi_{0-}|\psi_{0+}\rangle)} (\langle\psi_{0+}| - \langle\psi_{0-}|)[(K + V_+)|\psi_{0+}\rangle - V_-|\psi_{0+}\rangle + V_+|\psi_{0-}\rangle - (K + V_-)|\psi_{0-}\rangle] \\
&= \frac{1}{2(1 - \langle\psi_{0-}|\psi_{0+}\rangle)} (\langle\psi_{0+}| - \langle\psi_{0-}|)[E_0|\psi_{0+}\rangle + V_-|\psi_{0+}\rangle - V_+|\psi_{0-}\rangle - E_0|\psi_{0-}\rangle] \\
&= \frac{1}{2(1 - \langle\psi_{0-}|\psi_{0+}\rangle)} (\langle\psi_{0+}| - \langle\psi_{0-}|)[E_0|\psi_{0+}\rangle + V_-|\psi_{0+}\rangle - V_+|\psi_{0-}\rangle - E_0|\psi_{0-}\rangle] \\
&= \frac{1}{2(1 - \langle\psi_{0-}|\psi_{0+}\rangle)} (\langle\psi_{0+}| - \langle\psi_{0-}|)[E_0|\psi_{0+}\rangle + V_-|\psi_{0+}\rangle - V_+|\psi_{0-}\rangle - E_0|\psi_{0-}\rangle] \\
&= \frac{1}{2(1 - \langle\psi_{0-}|\psi_{0+}\rangle)} [2E_0(1 - \langle\psi_{0-}|\psi_{0+}\rangle) + 2\langle\psi_{0+}|V_-|\psi_{0+}\rangle - 2\langle\psi_{0+}|V_+|\psi_{0-}\rangle] \\
&= E_0 + \frac{\langle\psi_{0+}|V_-|\psi_{0+}\rangle - \langle\psi_{0+}|V_+|\psi_{0-}\rangle}{1 - \langle\psi_{0-}|\psi_{0+}\rangle}
\end{aligned} \quad (18)$$

$$\begin{aligned}
\langle b|\hat{H}_{coupled}|b\rangle &= \frac{1}{2(1 + \langle\psi_{0-}|\psi_{0+}\rangle)} (\langle\psi_{0+}| + \langle\psi_{0-}|)[K + V_+ + V_-](|\psi_{0+}\rangle + |\psi_{0-}\rangle) \\
&= \frac{1}{2(1 + \langle\psi_{0-}|\psi_{0+}\rangle)} (\langle\psi_{0+}| + \langle\psi_{0-}|)[(K + V_+)|\psi_{0+}\rangle + V_-|\psi_{0+}\rangle + V_+|\psi_{0-}\rangle + (K + V_-)|\psi_{0-}\rangle] \\
&= \frac{1}{2(1 + \langle\psi_{0-}|\psi_{0+}\rangle)} (\langle\psi_{0+}| + \langle\psi_{0-}|)[E_0|\psi_{0+}\rangle + V_-|\psi_{0+}\rangle + V_+|\psi_{0-}\rangle + E_0|\psi_{0-}\rangle] \\
&= \frac{1}{2(1 + \langle\psi_{0-}|\psi_{0+}\rangle)} (\langle\psi_{0+}| + \langle\psi_{0-}|)[E_0|\psi_{0+}\rangle + V_-|\psi_{0+}\rangle + V_+|\psi_{0-}\rangle + E_0|\psi_{0-}\rangle] \\
&= \frac{1}{2(1 + \langle\psi_{0-}|\psi_{0+}\rangle)} (\langle\psi_{0+}| + \langle\psi_{0-}|)[E_0|\psi_{0+}\rangle + V_-|\psi_{0+}\rangle + V_+|\psi_{0-}\rangle + E_0|\psi_{0-}\rangle] \\
&= \frac{1}{2(1 + \langle\psi_{0-}|\psi_{0+}\rangle)} (\langle\psi_{0+}| + \langle\psi_{0-}|)[E_0|\psi_{0+}\rangle + V_-|\psi_{0+}\rangle + V_+|\psi_{0-}\rangle + E_0|\psi_{0-}\rangle] \\
&= E_0 + \frac{\langle\psi_{0+}|V_-|\psi_{0+}\rangle + \langle\psi_{0+}|V_-|\psi_{0-}\rangle}{1 + \langle\psi_{0-}|\psi_{0+}\rangle}
\end{aligned} \quad (19)$$

$$\langle b|\hat{H}_{coupled}|a\rangle = 0 \quad (20)$$

$$\langle a|\hat{H}_{coupled}|b\rangle = 0 \quad (21)$$

Note that the calculation of these matrix elements used Equation (16) and the following equations:

$$\langle \psi_{0+}|V_-|\psi_{0+}\rangle = \langle \psi_{0-}|V_+|\psi_{0-}\rangle$$

$$\langle \psi_{0+}|V_-|\psi_{0-}\rangle = \langle \psi_{0+}|V_+|\psi_{0-}\rangle \quad (22)$$

As apparent from Equations (20) and (21), since non-diagonal elements of the Hamiltonian matrix are zero, the Hamiltonian matrix is in fact diagonalized. Therefore, energy eigenvalues are:

$$\langle b|\hat{H}_{coupled}|b\rangle, \quad \langle a|\hat{H}_{coupled}|a\rangle$$

and their eigenvectors are:

$$|b\rangle = |\text{bonding}\rangle, \quad |a\rangle = |\text{antibonding}\rangle \quad (23)$$

In Equations (18) and (19), because of the localization of the wave function, $$1 \gg \langle \psi_{0-}|\psi_{0+}\rangle$$

$$\langle \psi_{0+}|V_-|\psi_{0+}\rangle \ll \langle \psi_{0+}|V_+|\psi_{0-}\rangle \quad (24)$$

are established, and so energies may be considered as:

$$E_{antibonding} \sim E_0 + \Delta E$$

$$E_{bonding} \sim E_0 - \Delta E$$

$$\Delta E = |\langle \psi_{0+}|V_+|\psi_{0-}\rangle| \quad (25)$$

When the transfer energy $\Delta E$ is small, electrons tends to be localized in respective quantum dots, and movements of electrons among quantum dots due to tunneling are suppressed. On the other hand, when the transfer energy $\Delta E$ is large, electrons moves among quantum dots due to tunneling.

Assume here that the size of each quantum dot constituting the quantum dot array is, for example, about 10 nm and the quantum dots are spaced apart by, for example, about 5 nm. The transfer energy $\Delta E$ between quantum dots in the quantum dot array is considerably large (for example, 10 meV, approximately), and a metallic conduction occurs in a range where the electron density of the quantum dot array is small. However, when the electron density of the quantum dot array increases to the degree of one electron per one quantum dot (the state corresponding to the electron density is called "half filled"), each electron is confined in each quantum dot due to interactions among electrons, and cannot conduct between the quantum dots. The system in this state is called a Mott insulator. The situation at this state would be such that electrons are filled in one, having a lower energy, of two subbands which are separated by a Hubbard gap (FIG. 1). The electron density of the quantum dot array exceeds the half filled state, electrons gradually come to be filled in the subband with a higher energy at the other side of the Hubbard gap, metallic conduction is made possible again (FIG. 2). In FIGS. 1 and 2, $\epsilon_F$ is the Fermi energy.

Next explained is an example of calculation of energy levels of coupled quantum dots.

Let the coupled quantum dots be made by heterojunction of compound semiconductors. The electron system in the coupled quantum dots confined by the compound semiconductor heterojunction may be modeled as a problem of a rectangular potential. Thus the two-electron system in the quantum dots can be described by the following Hamiltonian.

$$\hat{H} = -\frac{\hbar^2}{2} \sum_{j=1,2} \left[ \frac{\partial}{\partial x_j} \left( \frac{1}{m^*(x_j, y_j)} \right) \frac{\partial}{\partial x_j} + \frac{\partial}{\partial y_j} \left( \frac{1}{m^*(x_j, y_j)} \right) \frac{\partial}{\partial y_j} \right] + \sum_{j=1,2} V(x_j, y_j) + \frac{e^2}{4\pi\epsilon_r\epsilon_0} \frac{1}{\sqrt{(x_1 - x_2)^2 + (y_1 - y_2)^2}} \quad (26)$$

$$V(x_j, y_i) = \begin{cases} -V_0 & ((x_j, y_i) \in \text{QUANTUM DOT}) \\ 0 & ((x_j, y_j) \notin \text{QUANTUM DOT}) \end{cases} \quad (27)$$

$$V(x_j, y_i) = \begin{cases} m_{in} & ((x_j, y_i) \in \text{QUANTUM DOT}) \\ m_{out} & ((x_j, y_j) \notin \text{QUANTUM DOT}) \end{cases} \quad (28)$$

where j is the number identifying a quantum dot constituting the coupled quantum dots, and (j=1, 2) indicates two quantum dots. $V(x, y)$ is the one-body potential, $\epsilon_0$ is the dielectric constant in vacuum, $\epsilon_r$ is the specific dielectric constant, and e is the absolute value of the electron charge.

Assume here that one-electron system in the semiconductor can be described in effective mass $m^*(x,y)$ determined by the material and that the compound semiconductor heterojunction used for constructing the quantum dots is $Al_{0.45}Ga_{0.55}As/GaAs$ heterojunction. As the effective mass $m^*(x,y)$, the effective mass 0.067 $m_0$ ($=m_{in}$) of an electron in GaAs is used in the interior of the quantum dots, and the effective mass 0.104 $m_0$ ($=m_{out}$) of an electron in $Al_{0.45}Ga_{0.55}As$ is used in the exterior of the quantum dots. $m_0$ is the mass of the electron in vacuum. As $V_0$ in Equation (27), the band offset value 0.036 eV of $Al_{0.45}Ga_{0.55}As/GaAs$ heterojunction is used. In this case, interactions among electrons are Coulomb interactions, specific dielectric constant 10.9 of GaAs is used as the specific dielectric constant $\epsilon_r$. The shape of the coupled quantum dots is introduced in the form of the function of the one-body potential $V(x,y)$. By composing elements of the Hamiltonian matrix in Equation (26) of the base function of the harmonic oscillator and by numerically diagonalizing the Hamiltonian matrix, energy eigenvalues can be obtained.

The arrangement of coupled quantum dots used in the actual calculation is shown in FIG. 3. The coupled quantum dots is made by dividing a square quantum dot into two equal quantum dots by a space. The space has the width d, which behaves as the tunnel barrier between the quantum dots. As shown in FIG. 3, the coupling direction of the coupled quantum dots is taken as the x-axis, and the direction crossing the coupling direction at a right angle is taken as the y-axis. Classification of the quantum state by parities are here made on these two axes.

In the calculation made here, the length L of the longer side of the quantum dots is varied as 5 nm, 10 nm, 15 nm and 20 nm. FIGS. 4, 5, 6 and 7 show results of calculation of energy levels per one electron which are obtained for L=5 nm, 10 nm, 15 nm and 20 nm, respectively. The abscissa in FIGS. 4, 5, 6 and 7 is the distance d among quantum dots.

In FIG. 5, which shows the energy levels obtained in case of the typical example, L=10 nm, it corresponds to a single square quantum dot when d is zero, and the statistical nature of the energy levels is similar to that with two electrons filled in one electron state by satisfying the Pauli's exclusion principle. The reason why no correlation among electrons is effective is that the size of the quantum dots is too small for electrons to avoid each other. When d becomes 1 nm, the energy levels considerably change in comparison with a single square quantum dot (d=0), but it is recognized that the single ground state still exists. When d becomes from 2 nm to 3 nm, the ground state of the spin singlet approaches the excited state of the spin triplet, which apparently shows a degenerate tendency of the ground state. The situation at this state can be interpreted to be a Mott insulator in which electrons are localized in respective quantum dots and are only permitted to spin.

The four states near the ground state can be described in terms of the Heisenberg model:

$$\hat{H}_{Heisenberg} = \sum_{<i,j>,\alpha} JS_{i\alpha}S_{j\alpha} \tag{29}$$

$$S_{j\alpha} = \frac{1}{2}\sigma_\alpha \tag{30}$$

$$\sigma_1 = \begin{pmatrix} 0 & 1 \\ 1 & 0 \end{pmatrix} \sigma_2 = \begin{pmatrix} 0 & -i \\ i & 0 \end{pmatrix} \sigma_3 = \begin{pmatrix} 1 & 0 \\ 0 & -1 \end{pmatrix} \tag{31}$$

and its split width determines the value of |J|. In these equations, J is the exchange integral, S is the total spin angular momentum, and σ is the Pauli's matrix. Two states higher in energy than the foregoing four states are states in which two electrons enter in one of the quantum dots. As a result, six states, in total, can be described in term of the Hubbard model:

$$\hat{H}_{Hubbard} = \sum_{<i,j>,\sigma=\uparrow,\downarrow} t_{ij}\psi_{i\sigma}^\dagger \psi_{j\sigma} + \sum_j U_j \psi_{j\uparrow}^\dagger \psi_{j\uparrow} \psi_{j\downarrow}^\dagger \psi_{j\downarrow} \tag{32}$$

In this case, twice the difference between the ground state energy of the quadruple degeneracy and the excited state energy of the double degeneracy determines the on-site Coulomb energy $U_j$. The on-site Coulomb energy $U_j$ is an increase in energy caused by a Coulomb force experienced by two electrons which have enter in one quantum dot. $U_j$ becomes 30 meV, approximately, in case of L=10 nm, which is larger than the thermal energy 26 meV at room temperature.

In FIG. 5, when d exceeds 4 nm, the degenerate tendency becomes more apparent than in the foregoing six states, even in a high energy state. For degeneracy of upper states, a relatively large d is required due to a difference in heights of effective tunnel barriers. Degeneracy becomes complete with d of 5 nm or more, and the ground state energy decreases as d increases.

There are similar tendencies in case of FIGS. 4, 6 and 7 for L=5 nm, 15 nm and 20 nm. However, in case of L=20 nm, for example, the distance d between quantum dots must apparently be 1 nm, approximately.

The present invention has been made through vigorous studies on the basis of the knowledge obtained by the foregoing analysis and calculations.

According to an aspect of the invention, there is provided a field effect transistor in which a plurality of quantum boxes arranged adjacent to each other on a common plane are provided in a channel region.

The size of each quantum box and the distance among the quantum boxes are chosen so that the transfer energy among the quantum boxes is large enough for electrons to move from one quantum box to another by tunneling.

In the field effect transistor according to the invention, a gate electrode is provided on a plurality of quantum boxes.

In a working example of the field effect transistor according to the invention, an electron supplying layer is provided on the channel region.

In the field effect transistor according to the invention, the quantum boxes are preferably made of heterojunction of compound semiconductors. Examples of such heterojunction of compound semiconductors include AlGaAs/GaAs heterojunction and AlAs/GaAs heterojunction.

In the field effect transistor according to the invention, the quantum boxes may be made of junction of a semiconductor and an insulator. In such semiconductor/insulator junction, the semiconductor is typically composed of one or more group IV elements, and the insulator is composed of a compound of a group IV element and oxygen. In one example, the semiconductor is Si, and the insulator is $SiO_2$. An example of the semiconductor composed of two group VI elements is SiC.

According to the field effect transistor having the foregoing construction according to the invention, in which a plurality of quantum boxes are provided in the channel region, the electron density of the system made up of the quantum boxes can be changed by an electric field generated by applying a voltage to the gate electrode on the channel region. When the voltage applied to the gate electrode is small and the electron density of the system made up of the quantum boxes, the source-drain current increases as the potential of the gate electrode increases. When the potential of the gate electrode further increases, which makes the Fermi energy of the electron system to approach the Hubbard gap, the density of states near the Fermi surface decreases, and the source-drain current decreases. When the Fermi energy is placed in the Hubbard gap with a further increase in potential of the gate electrode, substantially no source-drain current flows, and a differential negative resistance is observed. When the Fermi energy exceeds the Hubbard gap with a further increase in potential of the gate electrode, the source-drain current again begins to flow. In this manner, the source-drain current is controlled.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
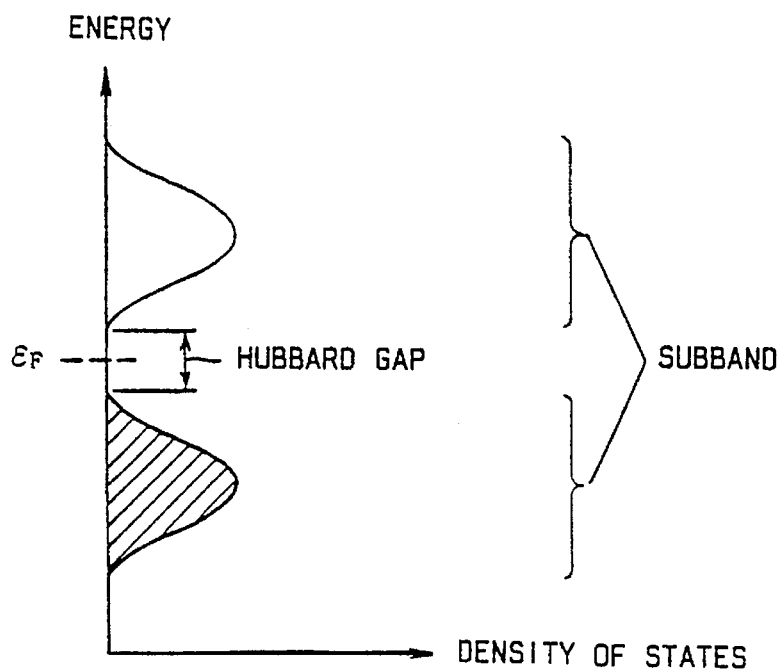
FIG. 1 is a schematic view for explaining changes in electron distribution caused by changes in electron density of a quantum dot array.
Figure 2:
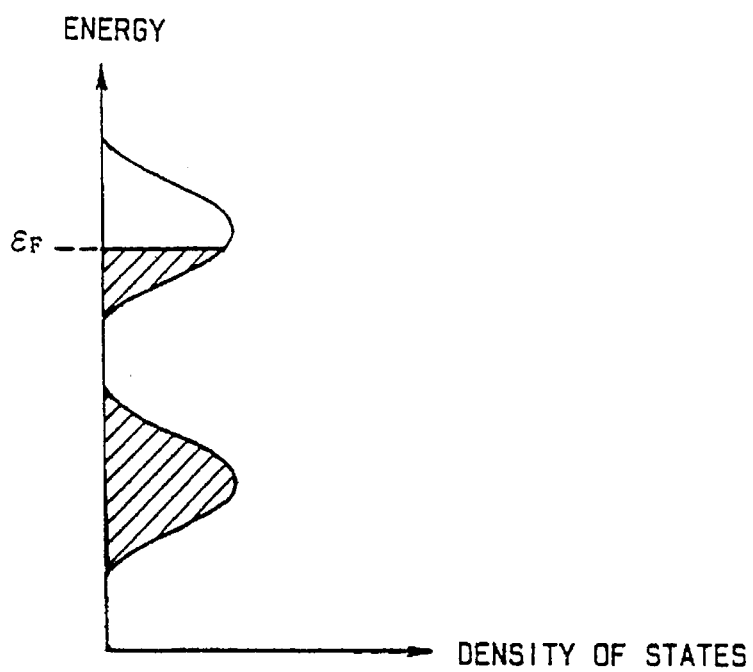
FIG. 2 is a schematic view for explaining changes in electron distribution caused by changes in electron density of a quantum dot array.
Figure 3:
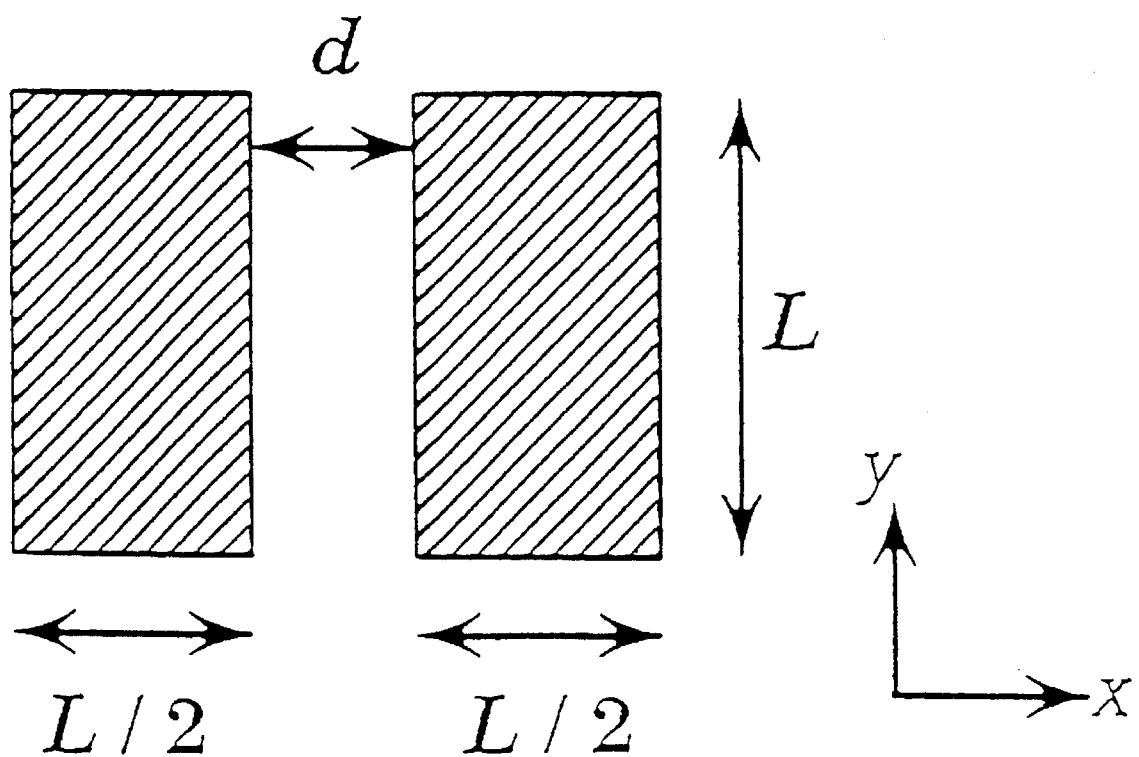
FIG. 3 is a schematic view showing a positional relationship between coupled quantum dots used in calculation of energy levels of a quantum dot array.
Figure 4:
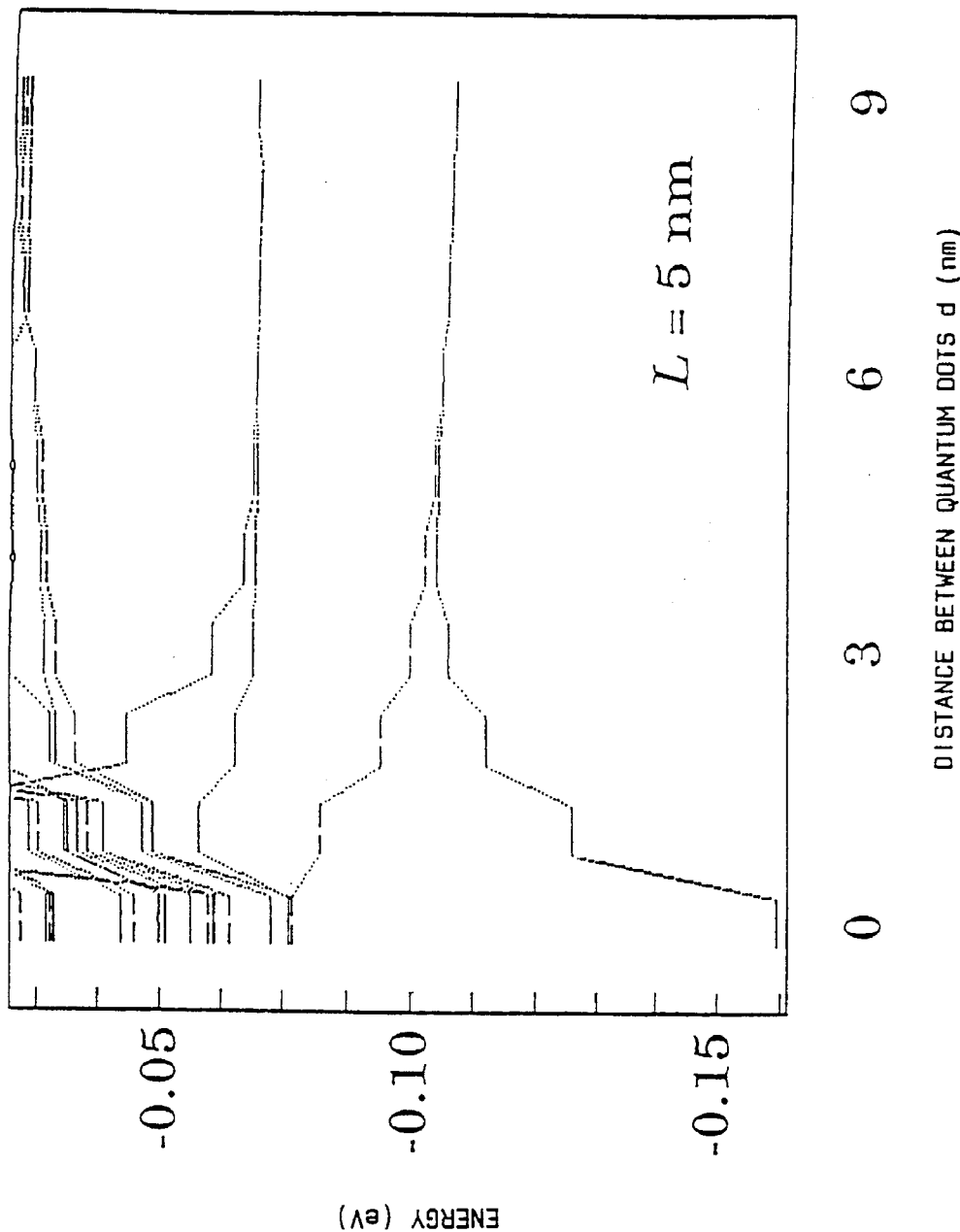
FIG. 4 is a graph showing a result of calculation of energy levels of a quantum dot array.
Figure 5:
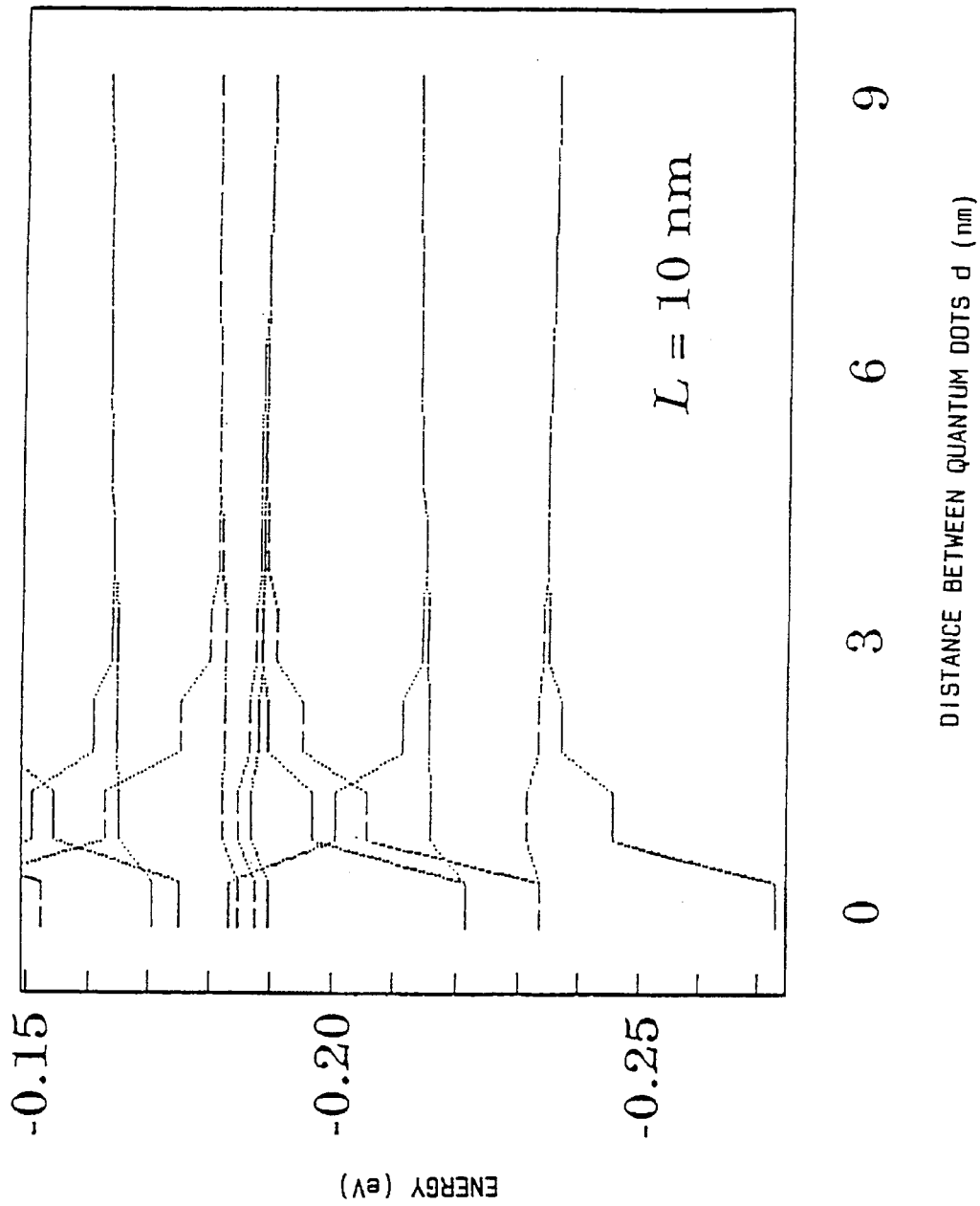
FIG. 5 is a graph showing a result of calculation of energy levels of a quantum dot array.
Figure 6:
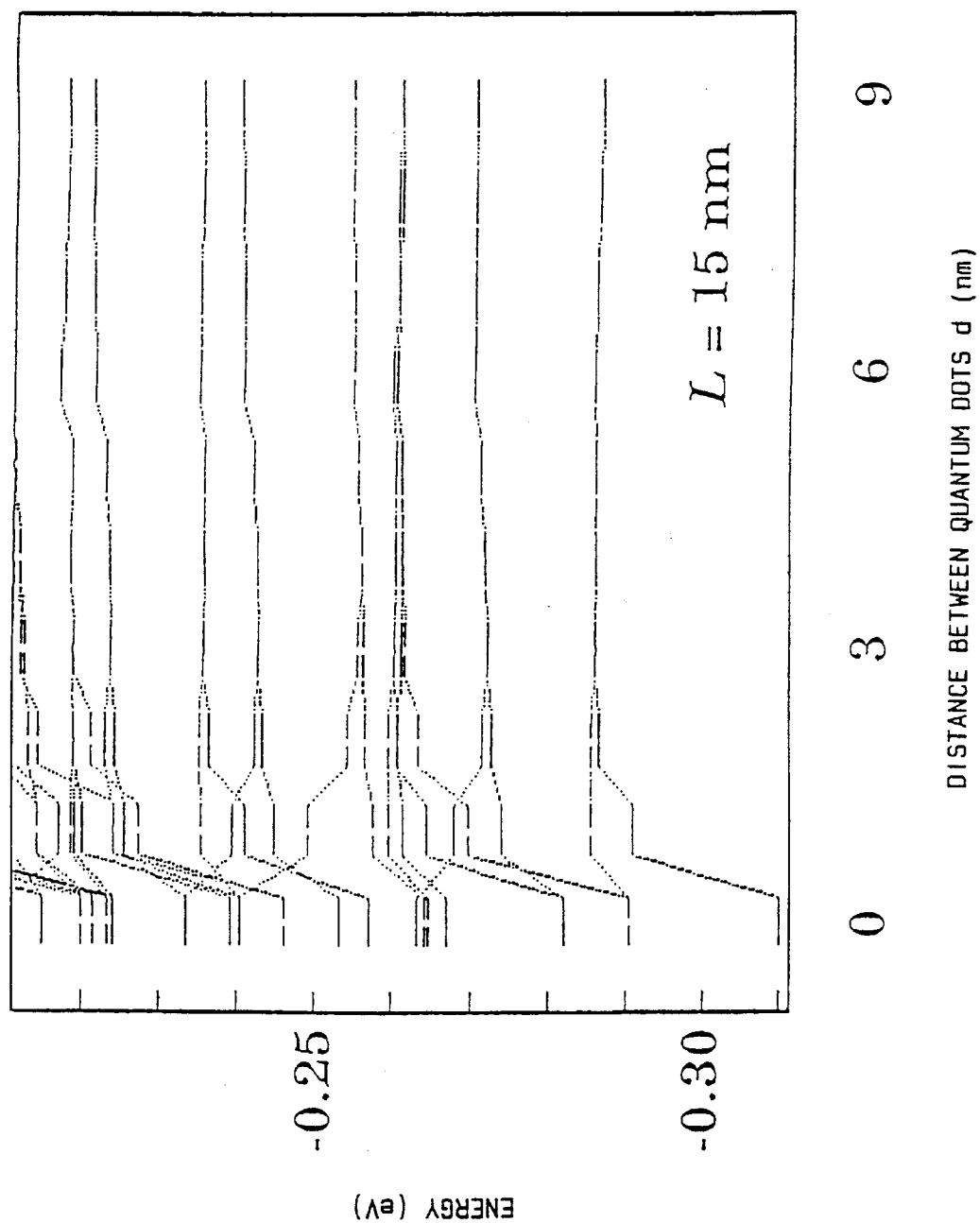
FIG. 6 is a graph showing a result of calculation of energy levels of a quantum dot array.
Figure 7:
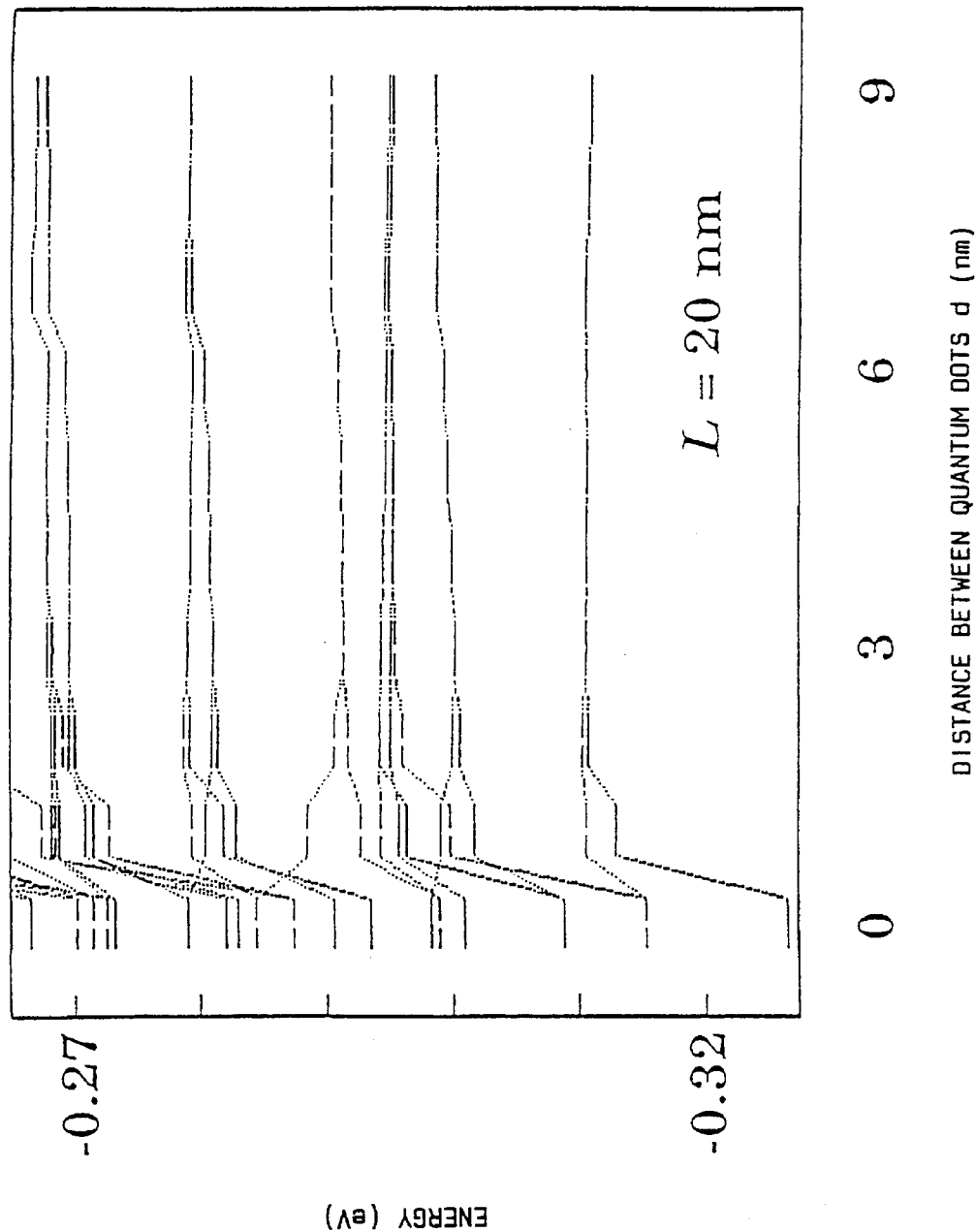
FIG. 7 is a graph showing a result of calculation of energy levels of a quantum dot array.

Embodiments of the invention will be described below with reference to the drawings. In all figures illustrating the embodiments, identical or equivalent portions are labelled with common reference numerals.

Figure 8:
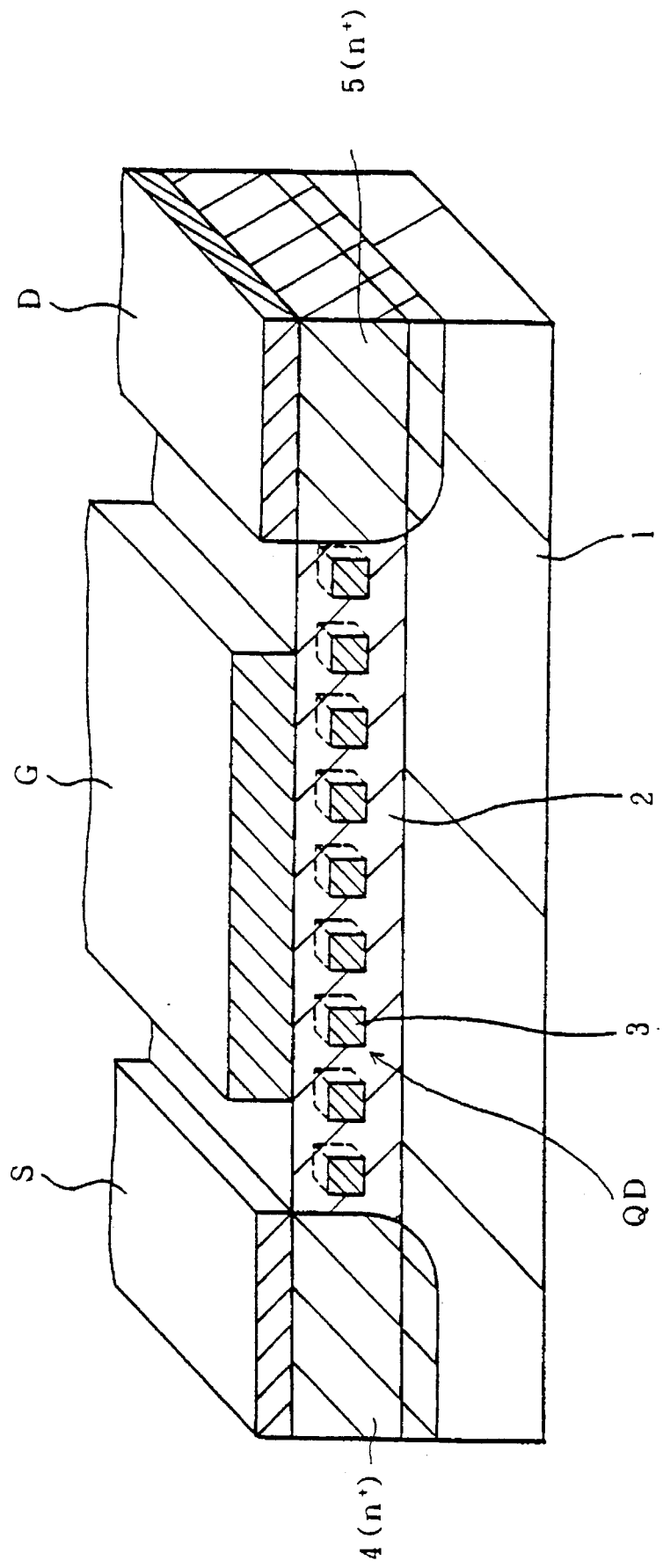
FIG. 8 is a perspective view of a field effect transistor according to a first embodiment of the invention.

FIG. 8 shows a field effect transistor according to a first embodiment of the invention.

As shown in FIG. 8, in the field effect transistor according to the first embodiment, an AlGaAs layer 2 as a barrier layer is provided on, for example, a semi-insulating GaAs substrate 1, preferably via a buffer layer (not shown). In a portion of the AlGaAs layer 2 behaving as a channel region, a plurality of box-shaped GaAs layers 3 behaving as quantum well portions are buried in a two-dimensional arrangement in a common plane. The structure of each GaAs layer 3 as a quantum well portion surrounded by the AlGaAs layer 2 as the barrier layer makes up a quantum dot QD in the form of AlGaAs/GaAs heterojunction, and a plurality of such quantum dots QD in a two-dimensional arrangement in a common plane make a two-dimensional quantum dot array.

In this case, the size of each quantum dot QD and the distance of the quantum dots QD are chosen so that the transfer energy among the quantum dots QD is large enough for electrons to move from one quantum dot QD to another by tunneling. For example, the size of each quantum dot QD may be 10 nm, and the distance among the quantum dots QD may be 5 nm.

A source region 4 and a drain region 5 of, for example, an $n^+$-type, are provided on one side and the other side of the quantum dot array. Provided on the source region 4 and the drain region 5 are a source electrode S and a drain electrode D in ohmic contact with the source region 4 and the drain region 5, respectively. Further provided on the AlGaAs layer 2 between the source region 4 and the drain region 5 is a gate electrode G. The gate electrode G and the AlGaAs layer 2 make a Schottky junction. The gate electrode G, source electrode S and drain electrode D are made of a metal.

Next explained are operations of the field effect transistor having the foregoing construction according to the first embodiment.

By increasing a bias voltage applied to the gate electrode G, that is, the gate voltage, electrons rush from environs into the quantum dot array provided in the channel region, resulting in an increase in electron density of the quantum dot array. When the gate voltage is small and the electron density of the quantum dot array is low, the source-drain current increases as the gate voltage increases. When the gate voltage further increases, which makes the Fermi energy of the electron system in the quantum dot array to approach the Hubbard gap, the density of states near the Fermi surface decreases, and the source-drain current decreases. When the Fermi energy is placed in the Hubbard gap with a further increase in the gate voltage, substantially no source-drain current flows, and a differential negative resistance is observed. When the Fermi energy exceeds the Hubbard gap with a further increase in the gate voltage, the source-drain current again begins to flow. According to this principle, the source-drain current is controlled.

Next explained is a method for manufacturing the field effect transistor with the above construction according to the first embodiment.

Figure 9:
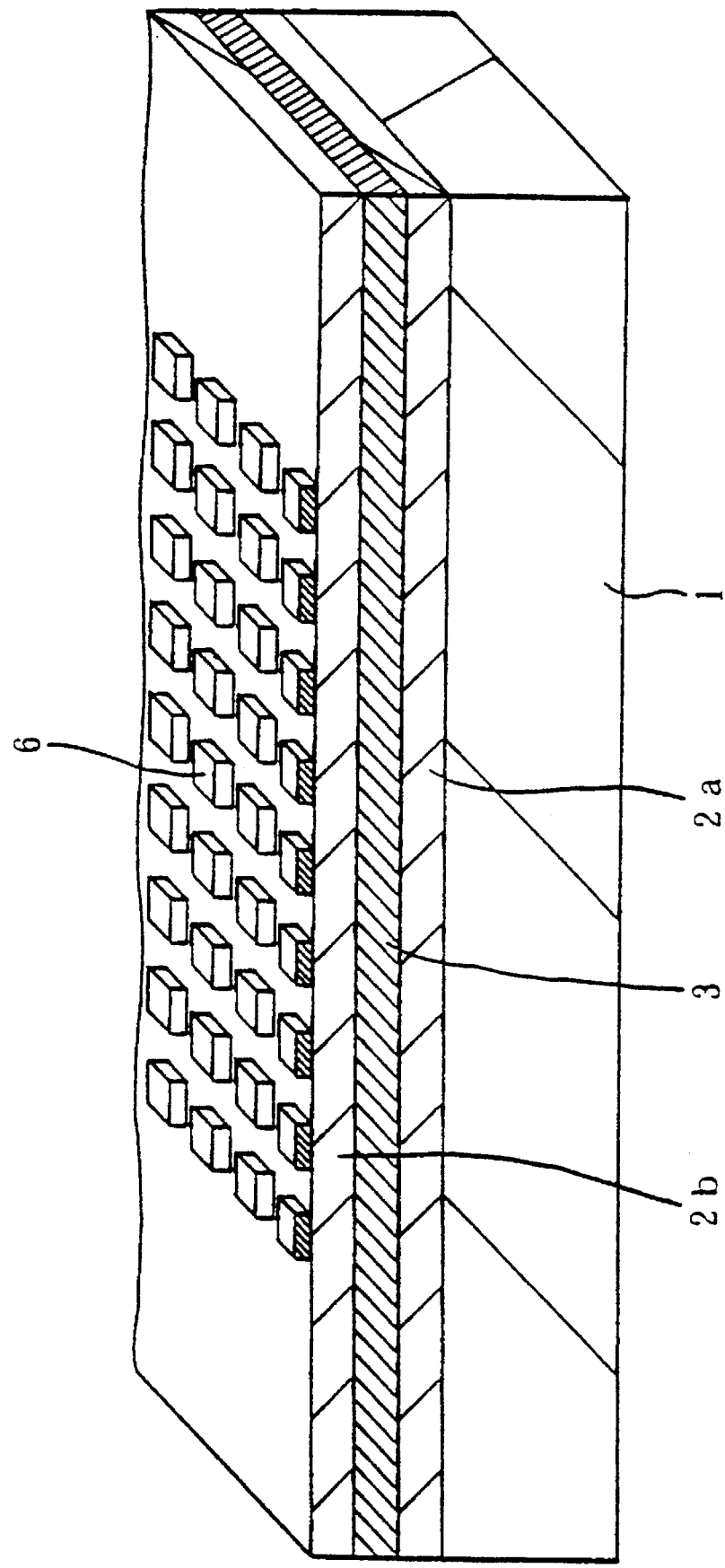
FIG. 9 is a perspective view for explaining a manufacturing method of the field effect transistor according to the first embodiment of the invention.

As shown in FIG. 9, sequentially epitaxially grown on the semi-insulating GaAs substrate 1 are an AlGaAs layer 2a, GaAs layer 3 and AlGaAs layer 2b by metallorganic chemical vapor deposition (MOCVD), for example. Next made in a location for quantum dots on the AlGaAs layer 2b is a resist pattern 6 by electron beam lithography, for example.

Figure 10:
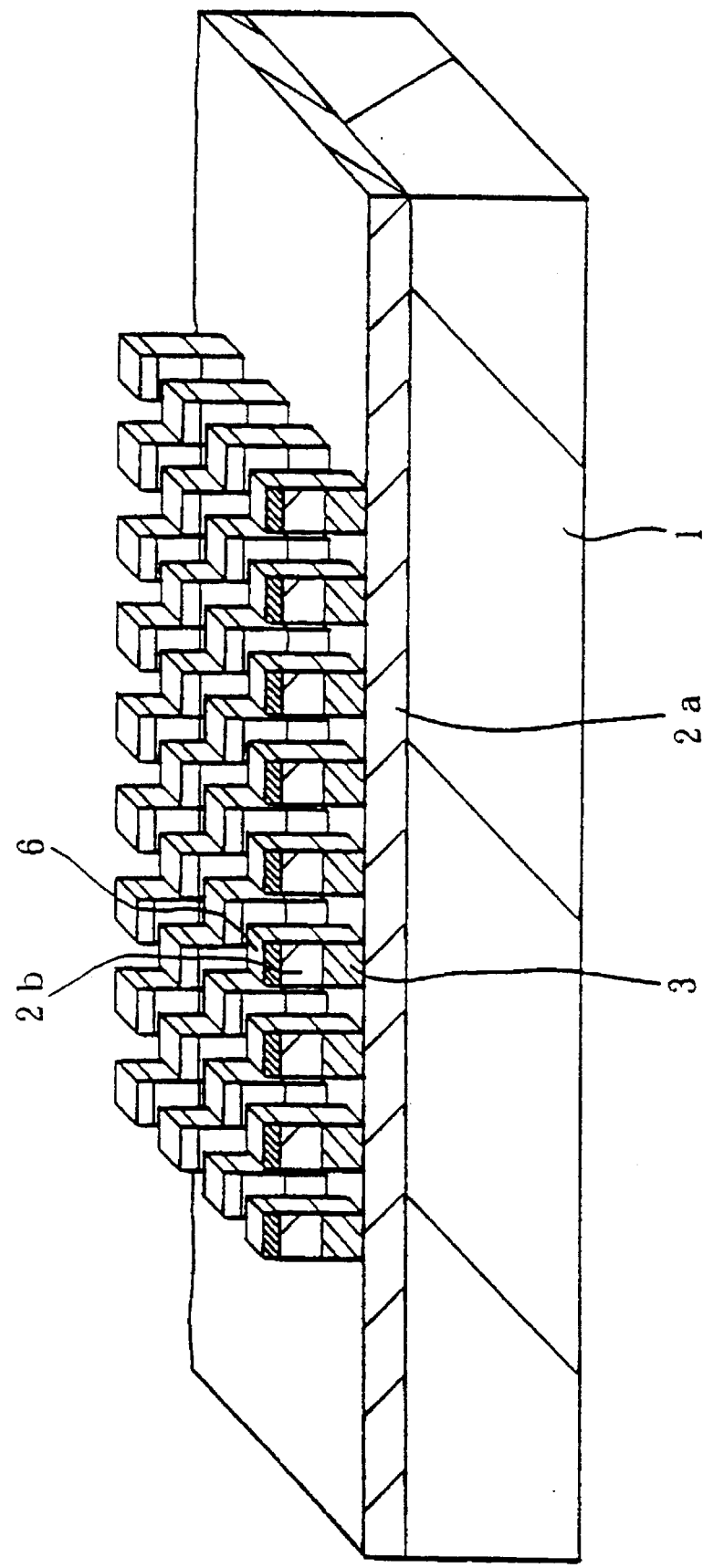
FIG. 10 is a perspective view for explaining a manufacturing method of the field effect transistor according to the first embodiment of the invention.
Figure 11:
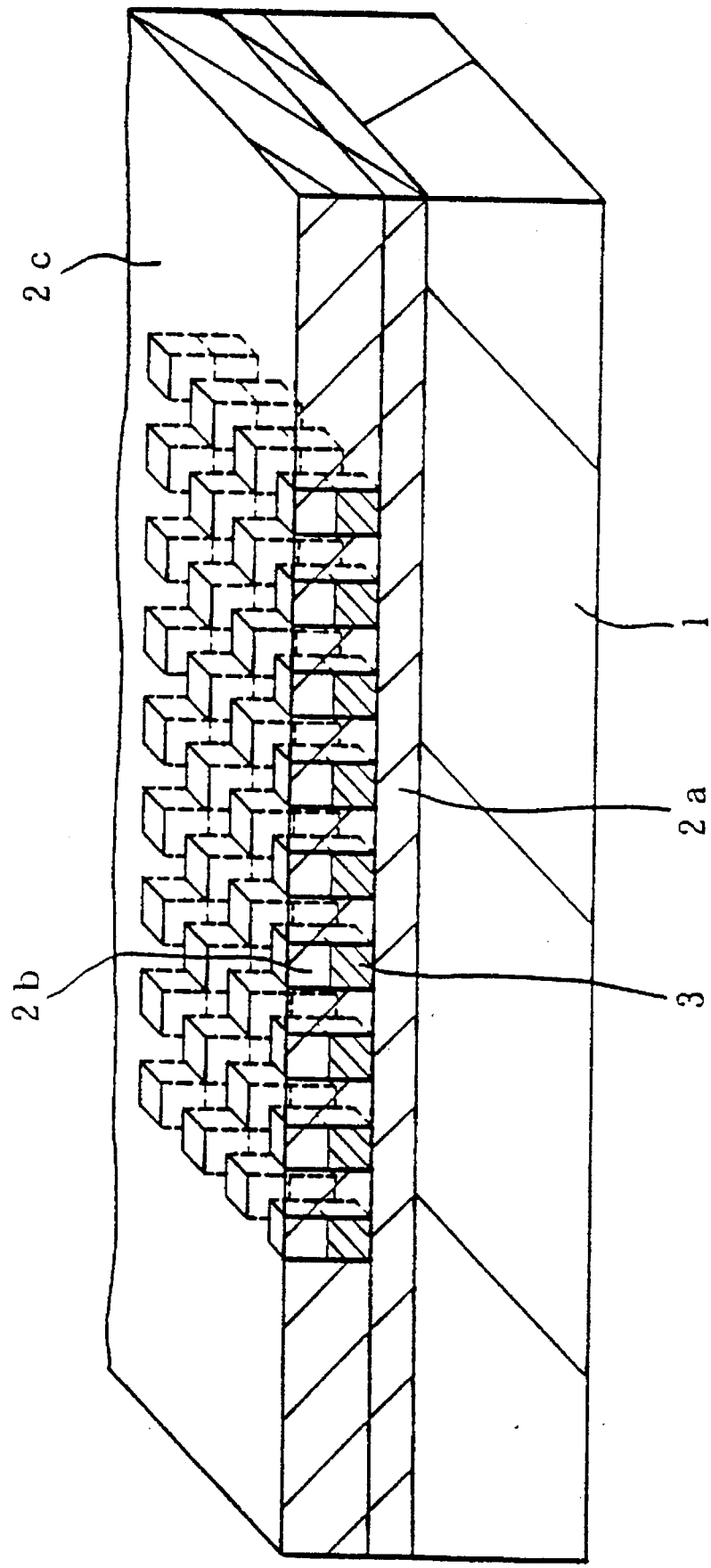
FIG. 11 is a perspective view for explaining a manufacturing method of the field effect transistor according to the first embodiment of the invention.

The resist pattern 6 is next used as a mask for anisotropic etching vertically of the substrate surface by reactive ion etching (RIE), for example. The anisotropic etching is done until exposing the AlGaAs layer 2a. As a result, the GaAs layer 3 and the AlGaAs layer 2b are patterned into square columns as shown in FIG. 10.

Next, after removing the resist pattern 6, an AlGaAs layer 2c is epitaxially grown on the entire surface of the structure by MOCVD, for example, so as to fill gaps among square columns of the GaAs layer 3 and the AlGaAs layer 2b. Thus a quantum dot array is obtained.

Next, an n-type impurity is selectively ion-implanted into the AlGaAs layers 2a, 2b and 2c at opposite sides of the quantum dot array, for example, and the implanted impurity is then electrically activated by heat treatment, if necessary. As a result, the $n^+$-type source region 4 and drain region 5 are made on opposite sides of the quantum dot array as shown in FIG. 8. Next, after making a metal layer for source and drain electrodes on the entire surface of the structure by vacuum evaporation, for example, the metal layer is patterned by etching to make the source electrode S and the drain electrode D. After that, heat treatment is applied to bring the source electrode S and the drain electrode D into ohmic contact with the source region 4 and the drain region 5, respectively. Next, after making a metal layer for the gate electrode on the entire surface of the structure by vacuum evaporation, for example, the metal layer is patterned by etching to form the gate electrode G.

By these steps, the field effect transistor is completed.

As explained above, according to the first embodiment, because the coupled quantum dot array permitting electrons to move from one quantum dot QD to another by tunneling is provided in the channel region, a field effect transistor having a differential negative resistance is realized. In addition, because of a planar geometry in lieu of a longitudinal one like the existing RHET, the field effect transistor is advantageous when integrated on a common substrate.

The field effect transistor according to the first embodiment is suitable for use in making a logic IC, for example.

Figure 12:
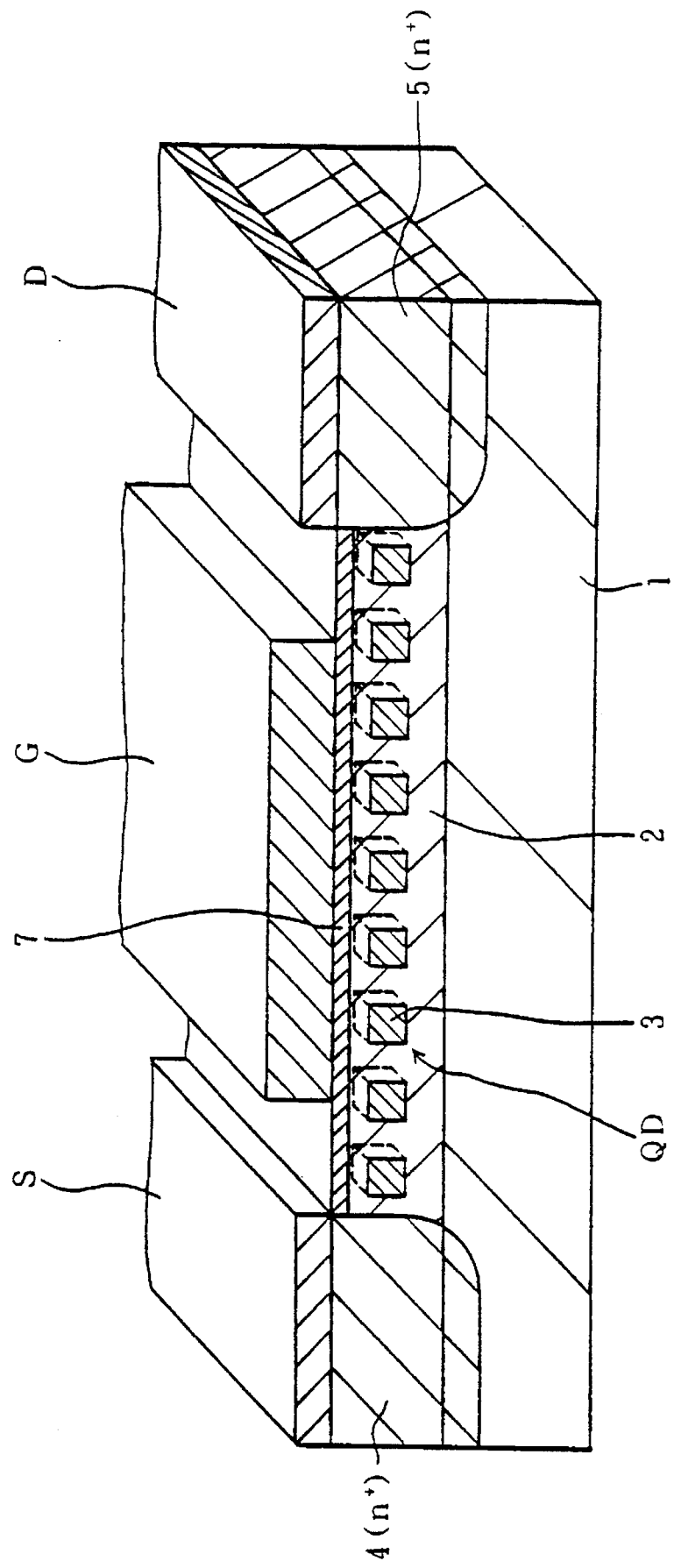
FIG. 12 is a perspective view of the field effect transistor according to a second embodiment of the invention.

FIG. 12 shows a field effect transistor according to a second embodiment of the invention.

As shown in FIG. 12, the field effect transistor according to the second embodiment includes an n-type AlGaAs layer 7 provided on the channel region to behave as an electron supplying layer. The remainder of the construction and the method for making the field effect transistor according to the second embodiment are identical to those of the first embodiment, and are omitted from explanation to avoid redundancy.

The second embodiment has, in addition to the advantages common to the first embodiment, a particular advantage that the electron density of the quantum dot array can be varied with a small gate voltage because electrons supplied from the n-type AlGaas layer 7 can be used as electrons to be introduced in the quantum dot array.

Figure 13:
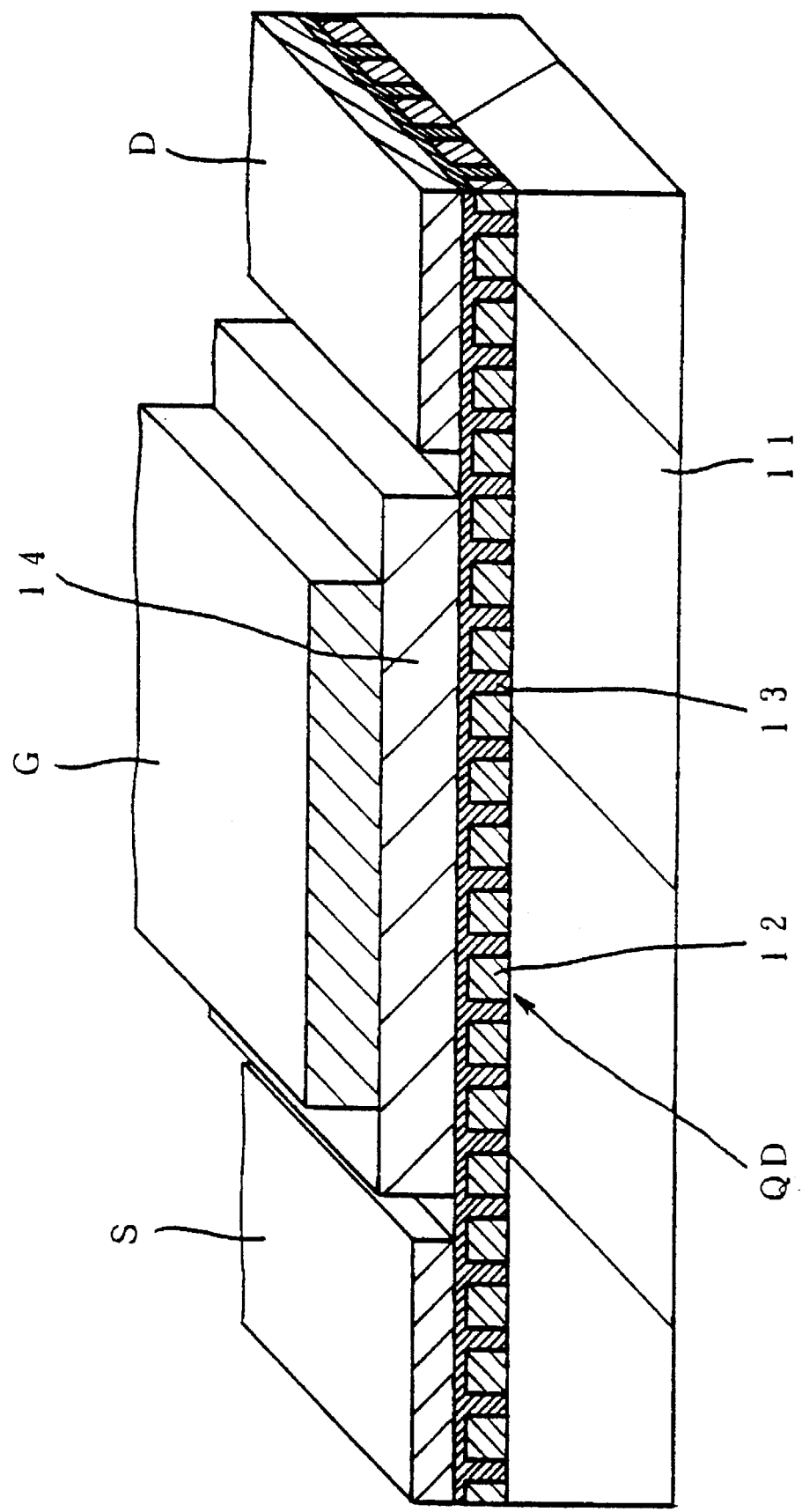
FIG. 13 is a perspective view of the field effect transistor according to a third embodiment of the invention.

FIG. 13 shows a field effect transistor according to a third embodiment of the invention.

As shown in FIG. 13, in the field effect transistor according to the third embodiment, a plurality of fine Si crystal grains 12 as quantum well portions are provided in a predetermined two-dimensional arrangement on a glass substrate 11, for example, preferably via a buffer layer (not shown). A $SiO_2$ film 13 as a barrier layer is provided so as to continuously surround surfaces of the Si crystal grains 12 so that the Si crystal grains 12 are isolated from each other by the $SiO_2$ film 13. The structure with each Si crystal grain 12 as a quantum well portion surrounded by the $SiO_2$ film 13 as a barrier layer makes up a quantum dot QD of $Si/SiO_2$ junction, and a plurality of such quantum dots QD are arranged on the glass substrate 11 to form a two-dimensional quantum dot array. In the third embodiment, the quantum dot array constitutes a channel region.

Like the first embodiment, the size of each quantum dot QD and the distance among the quantum dots are chosen so that the transfer energy among the quantum dots QD is large enough for electrons to move from one quantum dot QD to another by tunneling. For Example, the size of the quantum dot QD may be about 2 nm to 50 nm, and the distance among quantum dots QD, that is, the thickness of the $SiO_2$ film 13 as the barrier layer between adjacent quantum dots QD, may be about several nanometers to tens of nanometers.

A source electrode S and a drain electrode D are provided on one side and the other side of the quantum dot array. A gate electrode G is provided above the quantum dot array between the source electrode S and the drain electrode D via an insulating film 14 such as, for example, a $SiO_2$ film. The gate electrode G, source electrode S and drain electrode D are made of a metal.

Operations of the field effect transistor according to the third embodiment are identical to those of the field effect transistor according to the first embodiment, and are omitted from explanation to avoid redundancy.

Next explained is a method for manufacturing the field effect transistor having the foregoing construction according to the third embodiment.

Figure 14:
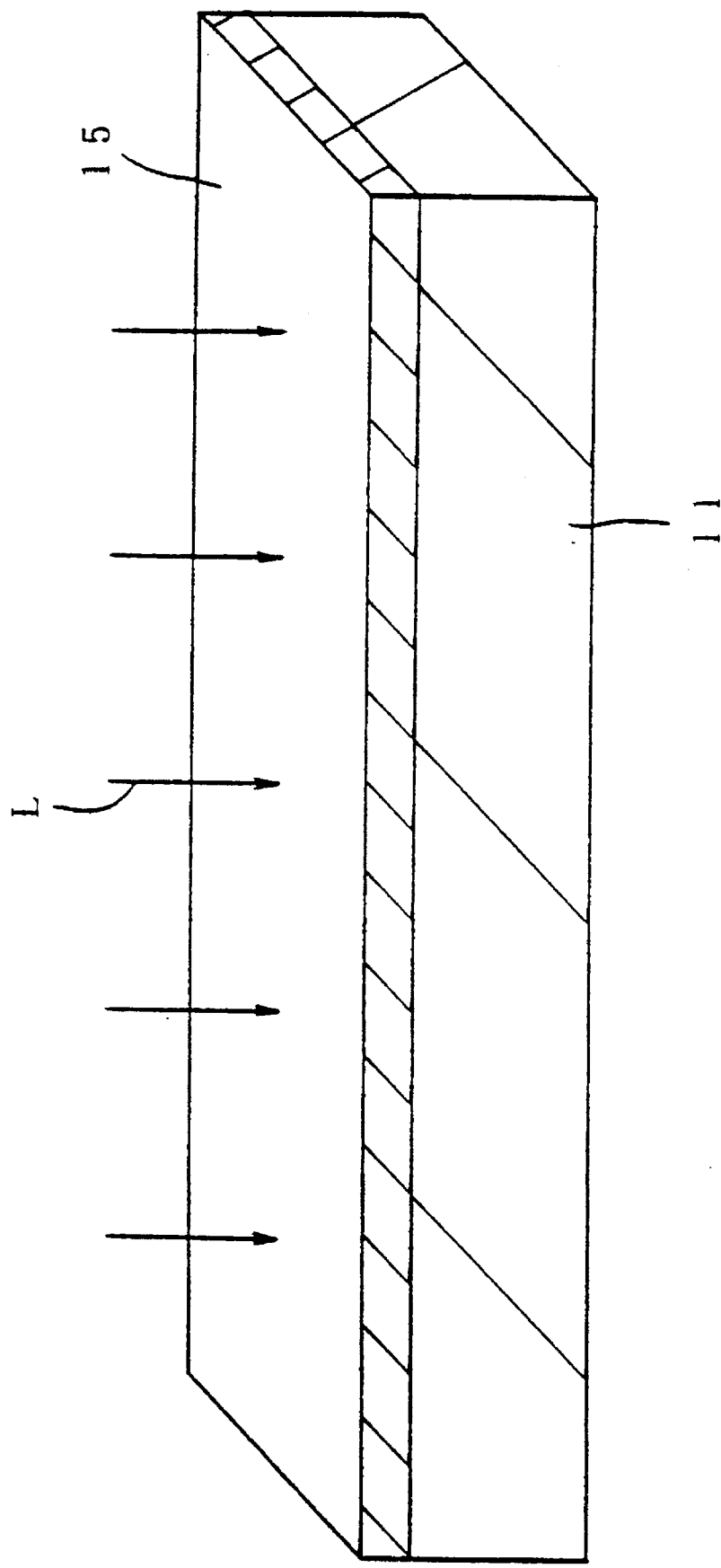
FIG. 14 is a perspective view for explaining a manufacturing method of the field effect transistor according to the third embodiment of the invention.

As shown in FIG. 14, a polycrystalline Si film 15 is deposited on the glass substrate 11 by CVD, for example. Considering that the thickness of the polycrystalline Si film 15 determines the size of each quantum dot QD, the thickness of the polycrystalline Si film 15 is chosen, for example, in the range of 10 nm to 100 nm, and more specifically as 10 nm. The polycrystalline Si film 15 may be doped with an impurity, if necessary.

Next, as shown in FIG. 14, a pulse laser beam L is irradiated to the entire surface of the polycrystalline Si film 15. The pulse laser beam L may be one with the wavelength of 308 nm from a XeCl excimer laser, for example, having the pulse width of 30 ns, for example, with the irradiating energy density of 180 mJ/cm$^2$, for example. The glass substrate 11 used is one resistant to heat due to irradiation of the pulse laser beam L.

Figure 15:
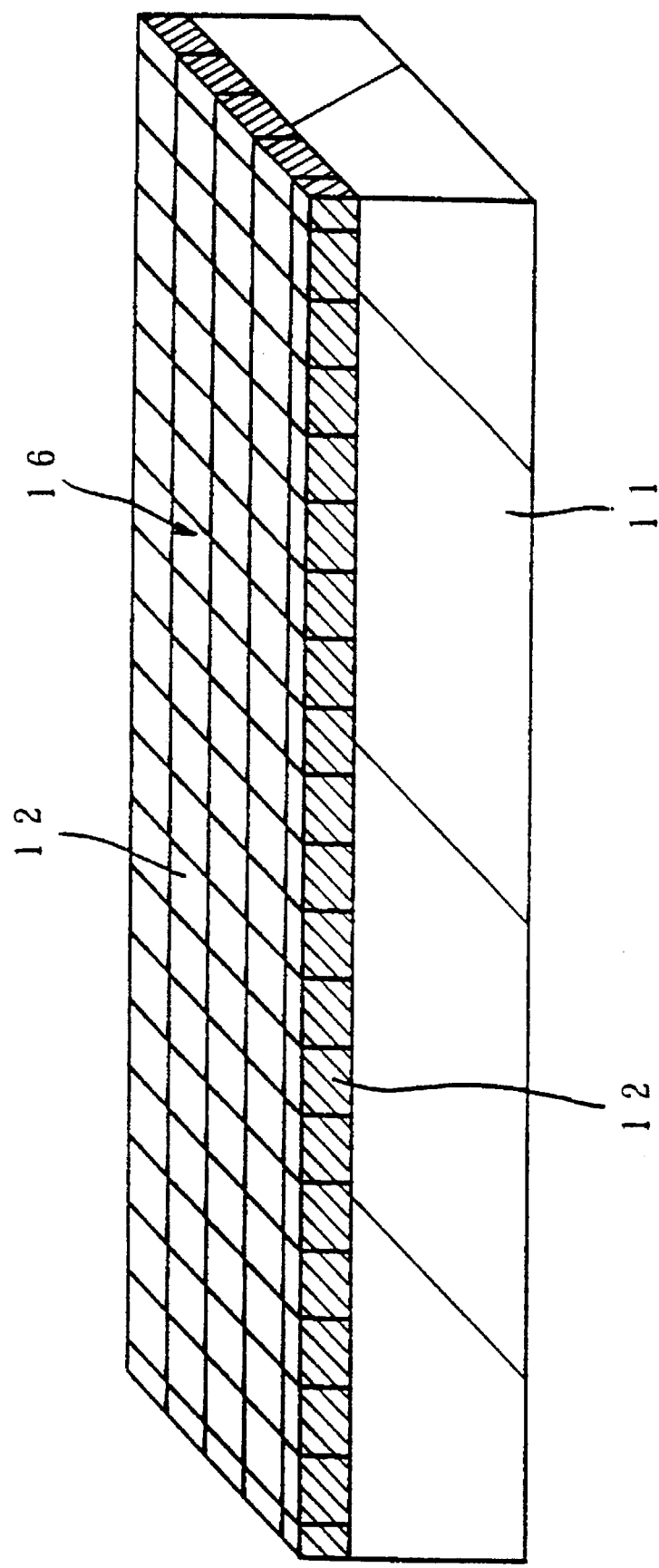
FIG. 15 is a perspective view for explaining a manufacturing method of the field effect transistor according to the third embodiment of the invention.

The polycrystalline Si film 15 is instantly heated to a high temperature and molten by irradiation of the pulse laser beam L, and it is cooled and solidified after completion of the irradiation. As a result, a polycrystalline Si film 16 constituted by uniform, fine Si crystal grains 12 (for example, 10 nm large, approximately) is obtained as shown in FIG. 15. Since the polycrystalline film 16, thus made, has a sufficiently large electric conductivity, it is presumed that substantially no scattering of electrons occurs at boundaries among respective Si crystal grains 12 and that no gap exists among individual Si crystal grains 12 (J. Appl. Phys. 70, 1281(1991)).

Figure 16:
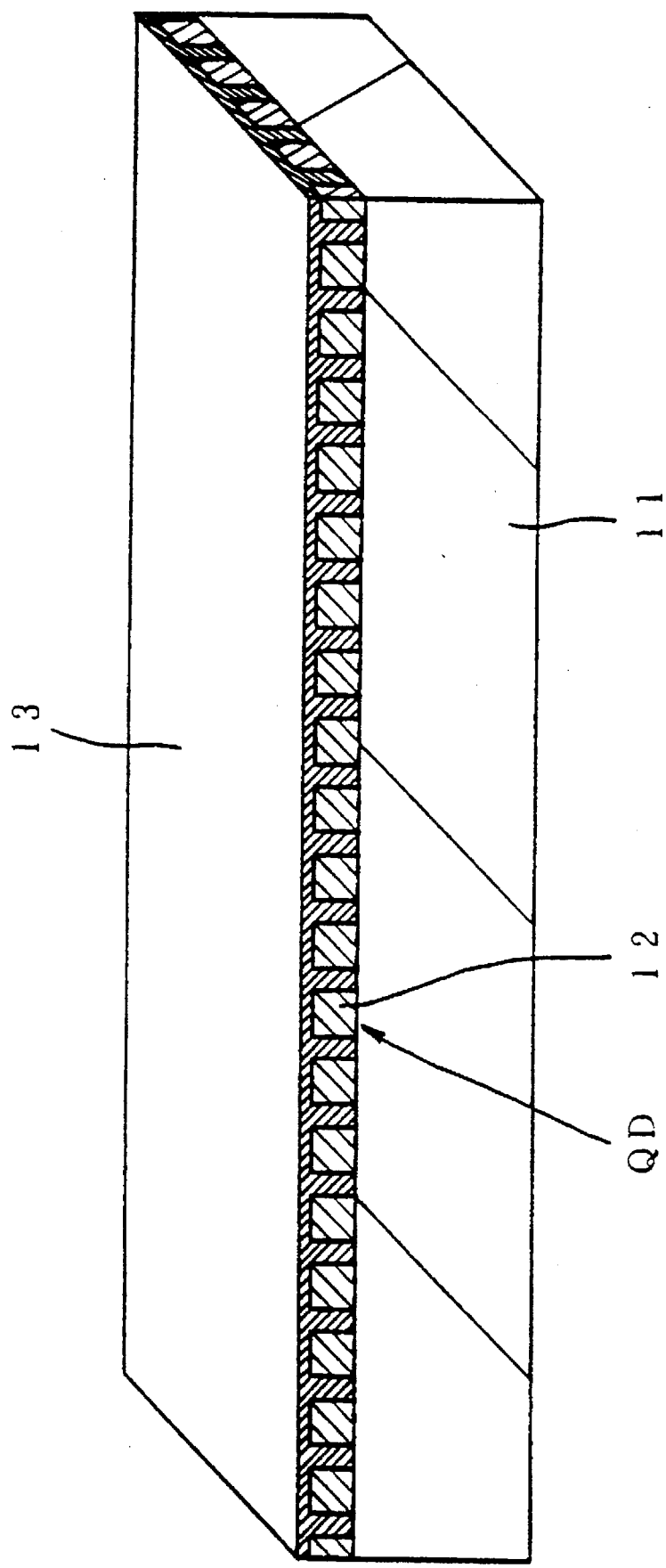
FIG. 16 is a perspective view for explaining a manufacturing method of the field effect transistor according to the third embodiment of the invention.

Next, as shown in FIG. 16, thermal oxidation is conducted to oxidize surfaces of the Si crystal grains 12 and form the $SiO_2$ film 13. The thermal oxidation is done for 30 minutes at 950° C. in oxygen gas diluted by nitrogen gas. During the thermal oxidation, oxygen taken from the exterior diffuses along boundaries among Si crystal grains 12 and enters in the Si crystal grains 12, which results in the $SiO_2$ film 13 being formed so as to surround individual Si crystal grains 12. The controllability of the thermal oxidation is so high that the thickness of the $SiO_2$ film 13 among Si crystal grains 12, that is, the thickness of the barrier layer between quantum dots QD, can be controlled to be several nanometers.

Obtained in this manner is the quantum dot array composed of a two-dimensional arrangement of a plurality of quantum dots QD each made of a fine Si crystal grain 12 surrounded by the $SiO_2$ film 13. Such fine quantum dots QD can be observed on a cross section of the field effect transistor through a scanning tunneling microscope or through blue shift on a photoluminescence spectrum.

Next, after making a mask (not shown) of a resist, for example, on the quantum dot array in a predetermined portion for location of the gate electrode, the insulating film 14, such as $SiO_2$ film, is made on the quantum dot array in a location not covered by the mask by CVD, for example, and a gate electrode G is made on the insulating film 14. After removing the mask, the source electrode S and the drain electrode D are provided on the quantum dot array in locations at opposite sides of insulating film 14.

In these steps, the field effect transistor is completed.

As described above, the third embodiment can realize a field effect transistor having a differential negative resistance, in which the channel region is formed by the quantum dot array constituted by a two-dimensional arrangement of a plurality of quantum dots QD made by $Si/SiO_2$ junction. The field effect transistor has a planar geometry which is advantageous for integration on a common substrate.

Since the field effect transistor according to the third embodiment can be made on a glass substrate 11 which is readily available even with a large area, applications in large-area integrated circuits are possible. For example, the field effect transistor is effective for use as a driver of a liquid crystal display.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first and second embodiments employ quantum dots QD in the form of AlGaAs/GaAs heterojunction, quantum dots QD may alternatively be made of AlAs/GaAs heterojunction, for example.

With regard to the third embodiment, a quartz substrate, Si substrate, or the like, may be used in lieu of the glass substrate 11 on which the quantum dot array is made. Further, in lieu of the polycrystalline Si film 15 as the starting material for making the polycrystalline Si film 16 constituted by Si crystal grains 12, an amorphous Si film may be used. As the insulating film 14, a $Si_3N_4$ film, for example, may be used in lieu of the $SiO_2$ film. The pulse laser beam L may also be one with the wavelength of 248 nm from a KrF excimer laser or with the wavelength of 350 nm from a XeF excimer laser.

Still referring to the third embodiment, heat treatment by irradiating the pulse laser beam L, that is, laser annealing for making the polycrystalline Si film 16 constituted by fine Si crystal gains 12, may be replaced by a method other than laser annealing, such as annealing using an ordinary heat treatment furnace, if appropriate. Appropriate temperature of the heat treatment is 200° to 1000° C.

The first, second and third embodiments have been explained as using a two-dimensional quantum dot array in which quantum dots are made in a two-dimensional arrangement; however, the invention involves the use of a one-dimensional or three-dimensional quantum dot array in which quantum dots are made in a one-dimensional or three-dimensional arrangement.

For example, by making two or more layers of two-dimensional quantum dot arrays in the third embodiment, a three-dimensional quantum dot array can be made. Such a three-dimensional quantum dot array may be fabricated by stacking two-dimensional quantum dot arrays by repeating the method for manufacturing the two-dimensional quantum dot array explained with reference to the third embodiment. In this case, insulating films such as $SiO_2$ films may be interposed between respective two-dimensional quantum dot arrays, if necessary.

As described above, according to the invention, since a plurality of quantum boxes arranged adjacent to each other on a common plane are provided in a channel region, a field effect transistor having a differential negative resistance and having a planar structure facilitating integration can be obtained.

What is claimed is:

1. A field effect transistor wherein a plurality of quantum boxes arranged adjacent to each other on a common plane are provided in a channel region, each of said quantum boxes comprising completely isolated volumes of one material completely surrounded at all sides by at least one different material.

2. The field effect transistor according to claim 1 wherein a gate electrode is provided on said plurality of quantum boxes.

3. The field effect transistor according to claim 1 wherein each of said quantum boxes is made of heterojunction of compound semiconductors.

4. The field effect transistor according to claim 3 wherein said heterojunction of compound semiconductors is one of AlGaAs/GaAs heterojunction and AlAs/GaAs heterojunction.

5. The field effect transistor according to claim 1 wherein an electron supplying layer is provided above said channel region.

6. The field effect transistor according to claim 1 wherein each of said quantum boxes is made of junction of a semiconductor and an insulator.

7. The field effect transistor according to claim 6 wherein said semiconductor comprises a group IV element, and said insulator comprises a compound of a group IV element and oxygen.

8. The field effect transistor according to claim 6 wherein said semiconductor is Si, and said insulator is $SiO_2$.

* * * * *